United States Patent
Wada et al.

(10) Patent No.: US 8,803,497 B2
(45) Date of Patent: Aug. 12, 2014

(54) CURRENT DETECTOR OF INDUCTIVE LOAD

(75) Inventors: Noriyuki Wada, Chiyoda-ku (JP);
Katsuyuki Sumimoto, Chiyoda-ku (JP);
Junya Sasaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 128 days.

(21) Appl. No.: 13/505,947

(22) PCT Filed: Jan. 7, 2010

(86) PCT No.: PCT/JP2010/050100
§ 371 (c)(1),
(2), (4) Date: May 3, 2012

(87) PCT Pub. No.: WO2011/083576
PCT Pub. Date: Jul. 14, 2011

(65) Prior Publication Data
US 2012/0217944 A1 Aug. 30, 2012

(51) Int. Cl.
*H02M 3/137* (2006.01)

(52) U.S. Cl.
USPC .......................... 323/282; 323/222

(58) Field of Classification Search
CPC .... H02M 3/155; H02M 3/156; H02M 3/1582
USPC ......................... 323/282–285, 222
See application file for complete search history.

(56) References Cited

U.S. PATENT DOCUMENTS

| | | | |
|---|---|---|---|
| 5,442,276 A * | 8/1995 | Schwartz et al. | 322/25 |
| 5,787,376 A | 7/1998 | Nishino et al. | |
| 6,812,675 B2 * | 11/2004 | Okamoto et al. | 322/28 |
| 6,987,380 B1 * | 1/2006 | Lee | 323/285 |
| 7,075,272 B2 * | 7/2006 | Sasaki et al. | 322/28 |
| 7,965,070 B2 * | 6/2011 | Nakahashi | 323/285 |

(Continued)

FOREIGN PATENT DOCUMENTS

| JP | 4-197100 A | 7/1992 |
|---|---|---|
| JP | 04197100 A | 7/1992 |

(Continued)

OTHER PUBLICATIONS

Japanese Office Action, issued Jul. 16, 2013 in Patent Application No. 2011-548890.

(Continued)

*Primary Examiner* — Matthew Nguyen
*Assistant Examiner* — Kyle J Moody
(74) *Attorney, Agent, or Firm* — Sughrue Mion, PLLC

(57) ABSTRACT

A current detector of an inductive load includes: an inductive load 100; a switching element 101 connected in series with the inductive load and controls an electric current to be carried through this inductive load by ON/OFF operation; a current circulating diode 102 connected in parallel with the inductive load and circulates an electric current of the inductive load when the switching element is OFF; current detecting device 103 making a sampling in a cycle of a predetermined sampling period to detect an electric current to be carried through the switching element 101; and current correction device 104 making a correction with respect to an electric current value having been detected at the current detector, and in which the current correction device 104 changes the correction rate based on DUTY of a pulse with which the switching element is brought in ON/OFF operation.

12 Claims, 8 Drawing Sheets

(56) References Cited

U.S. PATENT DOCUMENTS

| | | | |
|---|---|---|---|
| 2002/0030470 A1* | 3/2002 | Takahashi et al. | 322/28 |
| 2002/0047691 A1 | 4/2002 | Asada et al. | |
| 2004/0135374 A1 | 7/2004 | Maehara | |
| 2005/0074579 A1 | 4/2005 | Suzuki et al. | |
| 2006/0284607 A1* | 12/2006 | Isobe | 323/282 |
| 2008/0007235 A1* | 1/2008 | Hane et al. | 323/282 |
| 2008/0315852 A1* | 12/2008 | Jayaraman et al. | 323/285 |
| 2011/0101937 A1* | 5/2011 | Dobkin et al. | 323/282 |
| 2011/0316508 A1* | 12/2011 | Cheng et al. | 323/282 |

FOREIGN PATENT DOCUMENTS

| | | | |
|---|---|---|---|
| JP | 09074793 | A | 3/1997 |
| JP | 2776980 | * | 7/1998 |
| JP | 2000-350499 | A | 12/2000 |
| JP | 2000350499 | A | 12/2000 |
| JP | 2002-125399 | A | 4/2002 |
| JP | 2002125399 | A | 4/2002 |
| JP | 2003143882 | A | 5/2003 |
| JP | 2004-208342 | A | 7/2004 |
| JP | 2007-89354 | A | 4/2007 |
| JP | 3919457 | B2 | 5/2007 |
| JP | 4017637 | B2 | 12/2007 |

OTHER PUBLICATIONS

Korean Office Action issued May 1, 2013 in Korean Application No. 10-2012-7010891.

* cited by examiner

CURRENT DETECTOR OF INDUCTIVE LOAD

CROSS REFERENCE TO RELATED APPLICATIONS

This application is a National Stage of International Application No. PCT/JP2010/050100, filed on Jan. 7, 2010, the contents of all of which are incorporated herein by reference in their entirety.

TECHNICAL FIELD

The present invention relates to a controller of a vehicle generator and, more particularly, to a "current detector of an inductive load" acting to detect an electric current carried through a field coil (inductive load) of a vehicle generator.

BACKGROUND ART

FIG. 11 is a diagram illustrating an arrangement of a controller of a vehicle generator disclosed in, for example, Patent Document 1 (the Japanese Patent No. 4017637 Gazette).

The controller of the vehicle generator illustrated in FIG. 11 includes a three-phase armature winding 1, a rectifier 2 acting to rectify an AC output voltage of the armature winding 1 into DC, a field coil (inductive load) 3 to which a DC output voltage from the rectifier 2 is supplied to form a field circuit, and a voltage regulator 4.

Thus, the DC output voltage having been regulated at a constant value by the voltage regulator 4 is supplied to various electrical loads 5 as well as charges a battery 6.

A transistor 7 of the voltage regulator 4 is connected in series with the field coil 3 and functions as a switching element to control a field current to be carried through the field coil 3 by its ON/OFF operation.

To circulate an electric current of the field coil 3 at the time of OFF operation of the transistor 7, a diode 8 is connected in parallel with the filed coil 3.

Further, a detecting resistor 9 is connected in series with the transistor 7, and the detecting resistor 9 functions as field current detecting means acting to detect an electric current of the field circuit.

As described above, the conventional controller of a vehicle generator employs: a current detector of an inductive load that is provided with an inductive load (field coil 3); a switching element (transistor 7) connected in series with this inductive load and makes an ON/OFF control of an electric current of the inductive load; a current circulating diode (diode 8) connected in parallel with the inductive load and circulates an electric current of the inductive load at the time of OFF the switching element; and a detecting resistor 9 connected in series with the switching element and functions as field current detecting means acting to detect an electric current of the inductive load.

Patent Document 1: the Japanese Patent No. 40017637 Gazette

DISCLOSURE OF THE INVENTION

Problem to be Solved by the Invention

Controller of a vehicle generator corrects an electric current value having been detected at field current detecting means and makes a variety of controls of a vehicle generator using a field current having been corrected.

However, in the conventional controller of a vehicle generator arranged as described above, in the case that DUTY of a switching element (transistor) (that is, the ratio of an ON time period with respect to a switching period) is small, for example, in the case of such an "extremely short pulse" that the ON time period of a switching element ends in a sampling timing of reading a current value of an electric current to be carried through the inductive load (field coil), even if an electric current value having been detected at field current detecting means is read, the read current value comes to be zero.

Thus, in the case that the period of a pulse with which a switching element is brought in ON is small, an accurate current value of an electric current to be carried through the inductive load cannot be obtained (detected), and a proper correction with respect to the current value having been detected cannot be executed.

The invention was made to solve the above mentioned problem and has an object of providing a "current detector of an inductive load" capable of accurately detecting an inductive load current value, even if DUTY of a pulse with which a switching element for controlling an electric current to be carried through an inductive load (field coil) is brought in ON/OFF operation is such one as an extremely short pulse of which ON time period of a switching element is considerably short.

Means of Solution to the Problem

A current detector of an inductive load according to the invention includes: an inductive load; a switching element connected in series with the mentioned inductive load and controls an electric current to be carried through the mentioned inductive load by ON/OFF operation; a current circulating diode connected in parallel with the mentioned inductive load and circulates an electric current of the inductive load when the mentioned switching element is OFF; current detecting means making a sampling in a cycle of a predetermined sampling period to detect an electric current to be carried through the mentioned switching element; and current correcting means making a correction with respect to an electric current value having been detected at the mentioned current detecting means, and in which the mentioned current correcting means changes the correction rate based on DUTY of a pulse with which the mentioned switching element is brought in ON/OFF operation.

Another current detector of an inductive load according to the invention includes: an inductive load; a switching element connected in series with the mentioned inductive load and controls an electric current to be carried through the mentioned inductive load by ON/OFF operation; a current circulating diode connected in parallel with the mentioned inductive load and circulates an electric current of the mentioned inductive load when the mentioned switching element is OFF; current detecting means making a sampling in a cycle of a predetermined sampling period to detect a circulated current to be carried through the mentioned current circulating diode; and current correcting means making a correction with respect to an electric current value having been detected at the mentioned current detecting means, and in which the mentioned current correcting means changes the correction rate based on DUTY of a pulse with which the mentioned switching element is brought in ON/OFF operation.

Effect of the Invention

According to the invention, since a correction is made with respect to an electric current value having been detected at the current detecting means based on DUTY (ratio of an ON time period with respect to a switching period) of a pulse with which a switching element is brought in ON/OFF operation, even if the DUTY of a pulse making an ON/OFF operation is such DUTY as an extremely short pulse of which ON time period is short, an inductive load current value can be accurately detected.

DESCRIPTION OF THE REFERENCE NUMERALS

Figure 1:
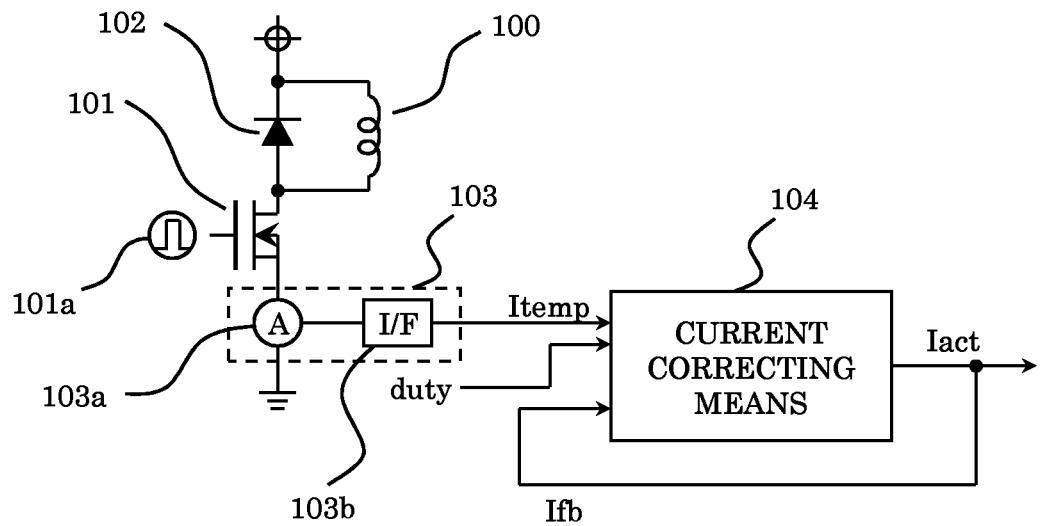
FIG. 1 is a diagram illustrating an arrangement of a current detector of an inductive load according to Embodiment 1.

100: inductive load
101: switching element
101a: pulse with which a switching element is brought in ON/OFF
102: current circulating diode
103: current detecting means
103a: sensing part
103b: interface part
104: current correcting means

BEST MODE FOR CARRYING OUT THE INVENTION

Hereinafter, preferred embodiments according to the present invention are described with reference to the drawings.

Incidentally, the same reference numerals are designated to like parts throughout the drawings.

Embodiment 1

FIG. 1 is a diagram illustrating the schematic arrangement of a "current detector an inductive load" according to Embodiment 1 of the present invention.

In FIG. 1, reference numeral 100 designates an inductive load such as a field coil to which a DC output voltage of, for example, a vehicle generator is supplied; numeral 101 designates a switching element located in series with the inductive load 100 and acting to control an electric current to be carried through the inductive load 100 by its ON/OFF operation; numeral 101a designates a pulse with which the switching element 101 is brought in ON/OFF operation; and numeral 102 designates a current circulating diode (also referred to as a free wheel diode) located in parallel with the inductive load 100.

Furthermore, numeral 103 designates current detecting means acting to detect an electric current to be carried through the switching element 101 (that is, an inductive load current carried through the inductive load 100), and numeral 104 designates current correcting means acting to correct a value "Itemp" of an electric current to be carried through the switching element 101" that the mentioned current detecting means 103 detects.

Incidentally, current detecting means 103 includes a sensing part (for example, a shunt resistor or a Hall element) 103a detecting an electric current to be carried through the switching element 101 and an interface part 103b making a proper conversion in order to input the output from the sensing part 103a to current correcting means 104.

Current detecting means 103 makes a sampling of an electric current to be carried through the switching element 101 (that is, an electric current to be carried through the inductive load 100 at the time of ON of the switching element 101) in a predetermined sampling period smaller than the switching period of the switching element 101, and obtains (detects) an electric current to be carried through the switching element 101.

Figure 2:
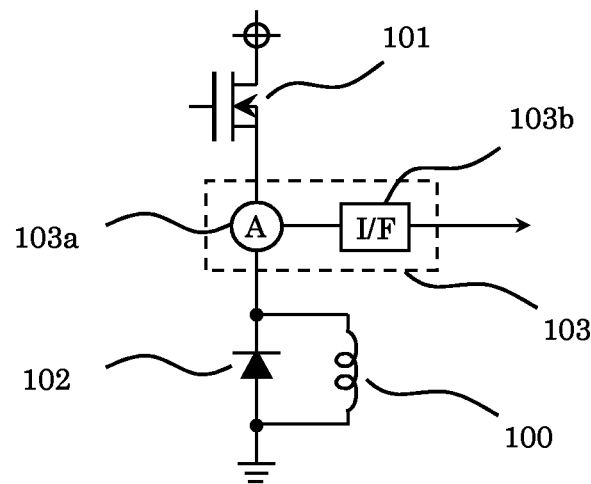
FIG. 2 is a diagram illustrating an arrangement of an essential part of HIGH side type.

In addition, although FIG. 1 illustrates the so-called "LOW side type" in which the inductive load 100 is located on the power source side and the switching element 101 is located on the GND side (that is on the ground side), it is preferable, at this portion, as is illustrated in FIG. 2, to employ the so-called "HIGH side type" in which the switching element 101 is located on the power source side and the inductive load is located on the GND side.

Besides, current detecting means 103 for detecting an electric current to be carried through the switching element 101 may be located in any place where an electric current to be carried only through the switching element 101 can be detected, so that it is preferable that current detecting means 103 is located on the upstream side (that is, on the power source side) of the switching element 101.

As is illustrated in FIG. 1, a detection current "Itemp" being an output from the current detecting means 103 (that is, a detection value of an inductive load current), "duty" being an ON time period command of the switching element 101 (that is, an ON pulse of the pulse 101a with which the switching element 101 is brought in ON/OFF operation) and an electric current value "Ifb" after the last correction by the current correcting means 104 are input to the current correcting means 104.

In addition, although "DUTY" is the "ratio of an ON time period with respect to a switching period" of the pulse 101a with which the switching element 101 is brought in ON/OFF operation, in the case of given as "duty" in the following descriptions, it means an ON time period command of the switching element 101 (that is, the ON pulse of the pulse 101a with which the switching element 101 is brought in ON/OFF operation).

Figure 3:
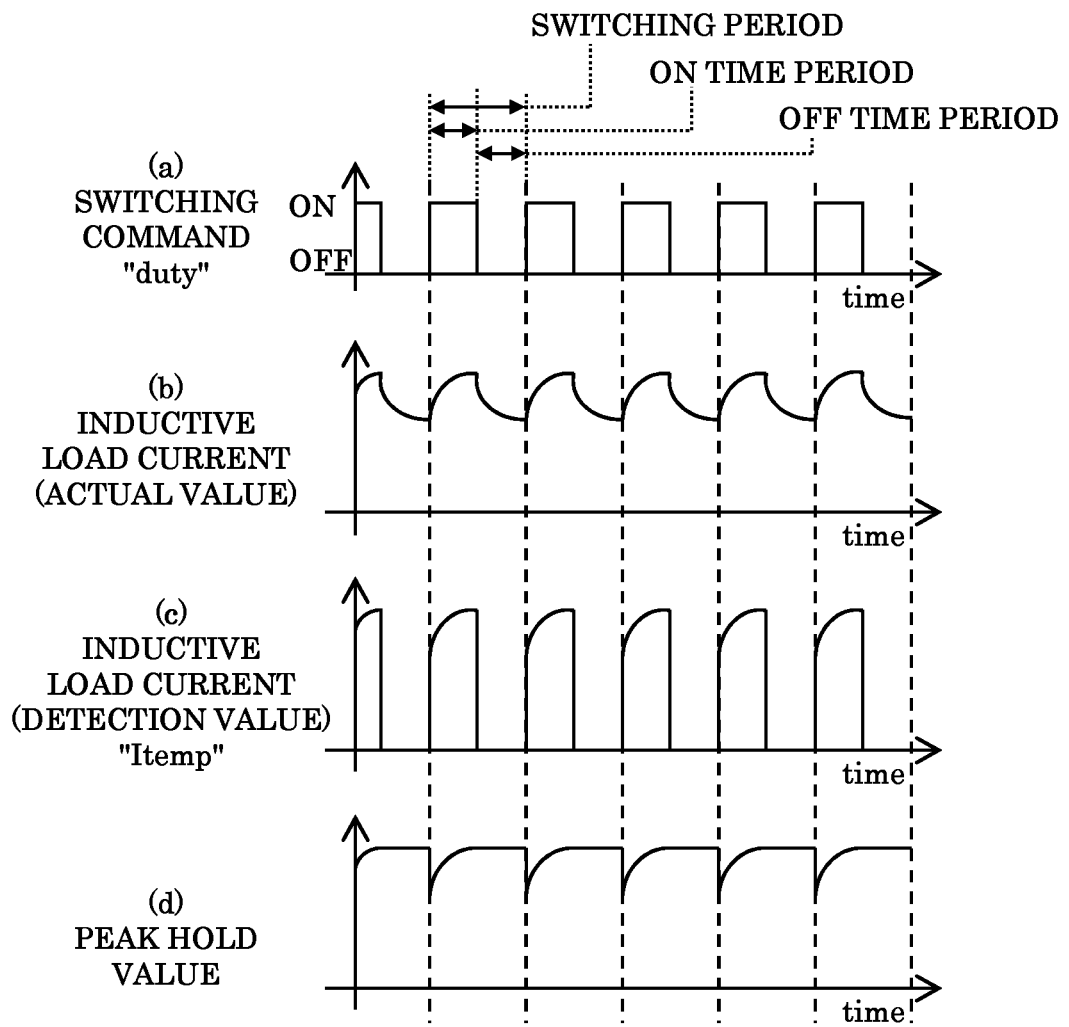
FIG. 3 relate to Embodiment 1 and are waveform charts for explaining the operation in the case that the sampling period of the current detecting means is sufficiently short with respect to the ON time period of a switching command.

FIG. 3 are charts illustrating waveforms of each part for explaining the operation of a "general case" in which the sampling period of current detecting means 103 is sufficiently short with respect to the ON time period of a switching command.

FIG. 3(a) represents a switching command "duty" being an ON/OFF command with respect to the switching element 101; FIG. 3(b) represents an inductive load current (actual value) to be actually carried through the inductive load 100; and FIG. 3(c) represents a detection value "Itemp" of the inductive load current to be detected at the current detecting means 103.

Incidentally, since the current detecting means 103 can detect only an electric current to be carried through the switching element 101, the detection value "Itemp" of the inductive load current is such a waveform as is illustrated in FIG. 3(c).

Furthermore, FIG. 3(d) represents a peak hold value that is obtained by making a peak hold of the detection value "Itemp" of the inductive load current illustrated in FIG. 3(c) for a switching period.

The waveform of the detection value of the inductive load current illustrated in FIG. 3(c), in a switching period, is obtained by sampling an electric current to be carried through the switching element 101 in a cycle of a predetermined sampling period.

In addition, the peak value of the detection value "Itemp" of the inductive load current having been detected by the current detecting means 103 is brought in hold by peak hold means not illustrated in the current correcting means 104.

By the way, in the case that the sampling period of the current detecting means 103 is sufficiently short with respect to the ON time period of a switching command, there come to be waveforms as is illustrated in FIG. 3. When, however, an inverse relationship holds, its waveforms will not be as is illustrated in FIG. 3.

Figure 4:
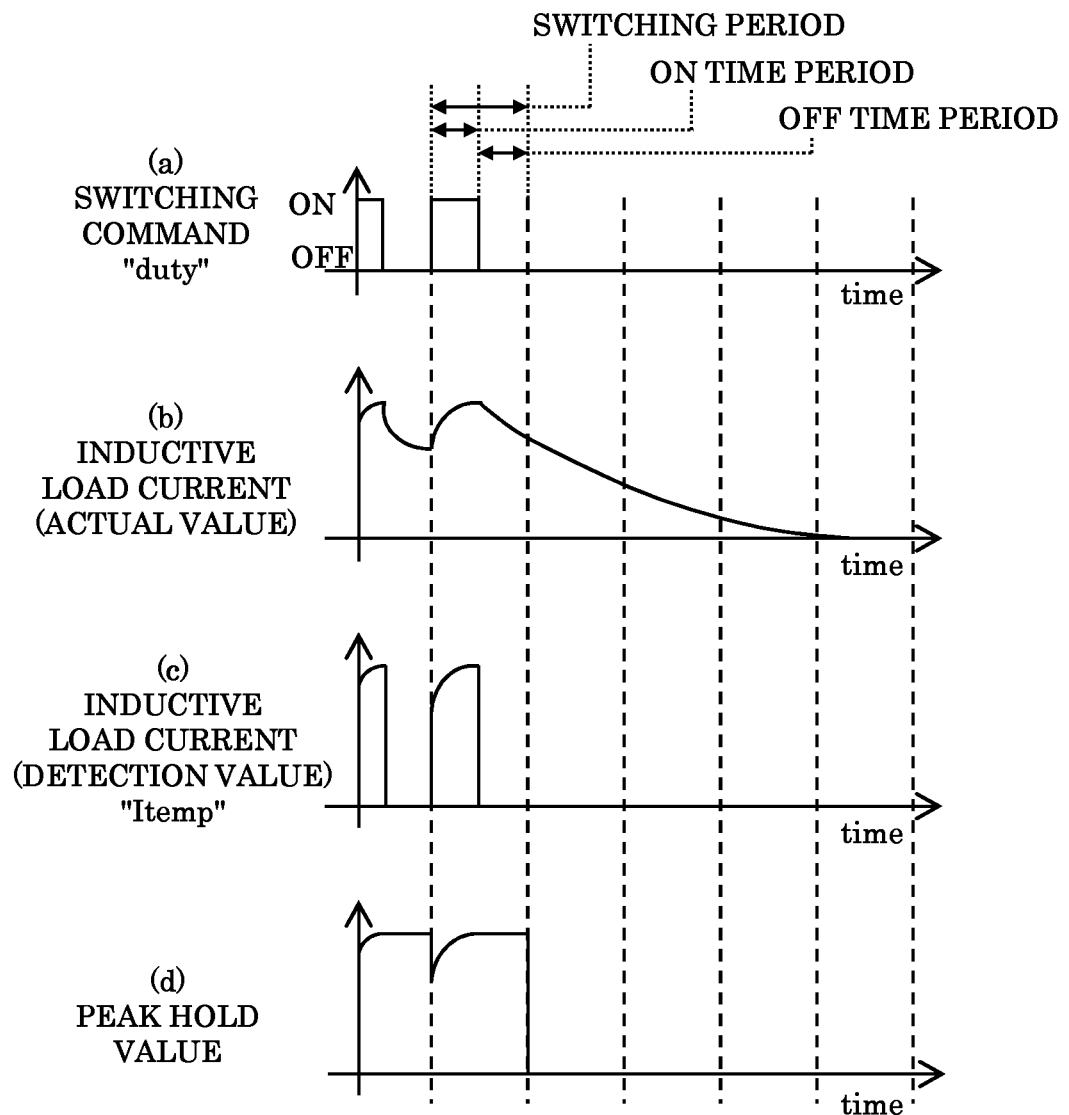
FIG. 4 relate to Embodiment 1 and are waveform charts for explaining the operation in the case that a value of an electric current to be carried through the inductive load is not corrected using current correcting means.

As an extreme example, waveforms of each part in the case that the ON time period of a switching command is changed from not less than a sampling period to zero (that is, in the case that the ON time period of a switching command is changed to zero) in the switching period, are illustrated in FIG. 4.

FIG. 4 are charts illustrating waveforms of each part for explaining the operation in the case that a "value of an electric current to be carried through the inductive load" current detecting means 103 detects is not corrected by the current correcting means 104.

FIG. 4(a) shows the case in which the ON time period of a switching command is made to be zero. That is, it shows the case in which there comes no ON pulse of a switching command in midway and the switching element 101 is fully OFF.

Incidentally, the ON time period of a switching command is changed based on the output request of a generator.

FIG. 4(a) represents a switching command "duty" being an ON/OFF command with respect to the switching element 101; FIG. 4(b) represents an inductive load current (actual value) to be actually carried through the inductive load 100; and FIG. 4(c) represents an inductive load current (detection value) "Itemp" detected at the current detecting means 103.

Incidentally, since the current detecting means 103 can detect only an electric current to be carried through the switching element 101, the detection value "Itemp" of the inductive load current is in such a waveform as is illustrated in FIG. 4(c).

That is, when there is no ON pulse of a switching command with which the switching element is brought in ON/OFF operation, the detection value "Itemp" of the inductive load current is zero.

Furthermore, FIG. 4(d) represents a peak hold value that is obtained by making a peak hold of the detection value "Itemp" of the inductive load current illustrated in FIG. 4(c) for a switching period.

As is illustrated in FIG. 4(c), there comes no detection value "Itemp" of the inductive load current in midway (that is it becomes zero), so that the peak hold value also comes to be zero in midway in response thereto.

As is illustrated in FIG. 4, on the occasion when a switching command is zero, no electric current is carried through the switching element 101, so that the detection value "Itemp" of the inductive load current is zero. Therefore, ever since there is no switching command, the peak hold value comes to be zero as well.

As is illustrated in FIG. 4(b), however, since an actual inductive load current to be carried through the inductive load 100 is decreased with a time constant, for a given period of time to be determined by a time constant, an incorrect value of the inductive load current (incorrect peak hold value) will be obtained.

That is, waveform of the peak hold value illustrated in FIG. 4(d) comes to be an incorrect waveform different from the change waveform of the actual value of the inductive load current illustrated in FIG. 4(b).

The waveform of this incorrect peak hold value, in the arrangement in which this current value is notified with respect to other control devices using, e.g., a serial communication in addition to its control device, since other control devices recognize the incorrect value having been obtained as well, gives rise to the reduction of reliability of the entire system (for example, an engine control system).

In this embodiment, to overcome such a problem, the inductive load current "Itemp" having been detected by the current detecting means 103 is corrected at the current correcting means 104 and an accurate current value "Iact" of the inductive load current is intended to obtain.

Specifically, an electric current value "Iact" after correction is calculated as is by the following equation (1) with an electric current value "Ifb" having been obtained in the last switching period, a switching period "Tsw" [s] and a time constant "λ" [A/s].

Incidentally, the unit of the time constant "λ" is [A/s] (electric current to be carried per unit of time) and different from the unit [s] of a general time constant, so that it should be noted.

$$Iact = Ifb - (+\lambda \times Tsw) \ [A] \qquad \text{equation (1)}$$

Here, it is preferable that the time constant "λ" [A/s] is a predetermined set value or it is preferable that it is sequentially operated in the switching OFF period.

Figure 5:
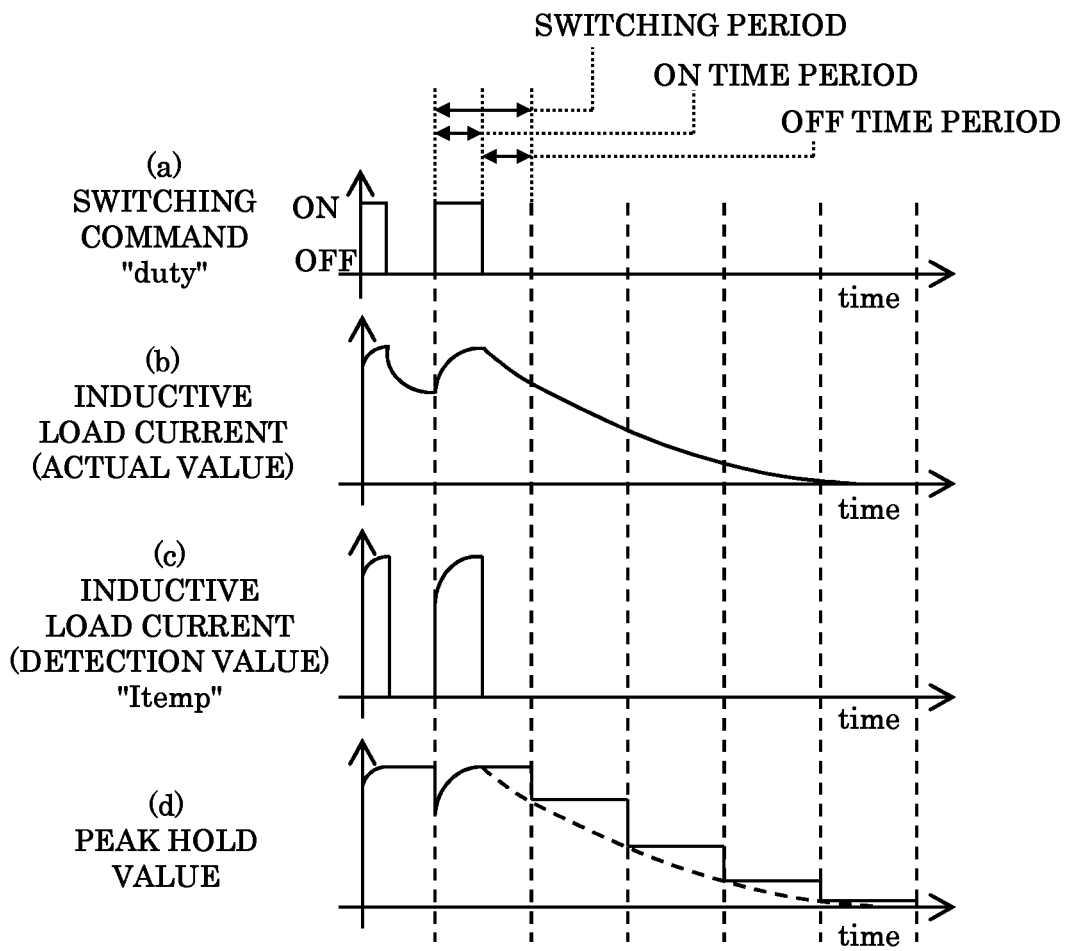
FIG. 5 relate to Embodiment 1 and are waveform charts for explaining the operation in the case that a detection value of an inductive load current is corrected using current correcting means.

In case of such an operation, waveforms of each part will be as is illustrated in FIG. 5.

FIG. 5 shows the case in which the inductive load current "Itemp" that the current detecting means 103 detects is corrected by the current correcting means 104.

FIGS. 5(a) to 5(c) illustrate the same waveforms as those of FIGS. 4(a) to 4(c).

That is, FIG. 5(a) represents a switching command "duty" being the ON/OFF command with respect to the switching element 101 and shows the case in which there comes no ON pulse of the switching command in midway and the switching element 101 is fully OFF. Incidentally, ON time period of the switching command is changed based on the output request of a generator.

FIG. 5(b) represents an inductive load current (actual value) to be actually carried through the inductive load 100, and FIG. 5(c) represents an inductive load current (detection value) "Itemp" to be detected at the current detecting means 103.

Since the current detecting means 103 can detect only the electric current to be carried through the switching element 101, the detection value "Itemp" of the inductive load current is in such a waveform as is illustrated in FIG. 5(c). That is, in the same manner as is in FIG. 4(c), when there comes no ON pulse of a switching command with which a switching element is brought in ON/OFF operation, the detection value "Itemp" of the inductive load current becomes zero.

Then, FIG. 5(d) illustrates the waveform of a peak hold value to be obtained by making a peak hold of the detection value "Itemp" of the inductive load current illustrated in FIG. 5(c) for a switching period. The change waveform (stepped change waveform) of the peak hold value of this FIG. 5(d) is a result "Iact" to be obtained by the operation of the above-given equation (1) when the duty is not more than a predetermined value, and corresponds to the change waveform of the "actual value of the inductive load current to be actually carried through the inductive load 100."

In addition, the broken line in FIG. 5(d), for comparison, is a transferred change waveform of the "inductive load current (actual value) to be actually carried through the inductive load" illustrated in FIG. 5(b).

The current correcting means 104 in this embodiment, with the use of the waveform of a peak hold value illustrated in FIG. 5(d), corrects the inductive load current "Itemp" that the current detecting means 103 detects. That is, the current correcting means 104, with the use of the change waveform of a peak hold value, changes the correction rate of the inductive load current "Itemp" that the current detecting means 103 detects based on DUTY of a pulse with which the switching element 101 is brought in ON/OFF.

As is described above, a current detector of an inductive load according to this embodiment includes: an inductive load 100; a switching element 101 connected in series with the inductive load 100 and controls an electric current to be carried through the mentioned inductive load by ON/OFF operation; a current circulating diode 102 connected in parallel with the inductive load 100 and circulates an electric current of the inductive load when the switching element is OFF; current detecting means 103 making a sampling in a cycle of a predetermined sampling period to detect an electric current to be carried through the switching element 101; and current correcting means 104 making a correction with respect to an electric current value having been detected at the current detecting means 103; and in which the current correcting means 104 changes the correction rate based on DUTY of a pulse with which the switching element is brought in ON/OFF operation.

Thus, according to this embodiment, even if DUTY of the pulse 101a (that is, a switching command) with which switching element 101 is brought in ON/OFF operation is such DUTY as an extremely short pulse of which ON time period is short, an accurate inductive load current value can be detected.

Furthermore, in this embodiment, the current detecting means 103 is arranged to be able to detect only an electric current to be carried through the switching element 101, and the current correcting means 103 makes a correction when the ON DUTY (ON time period) with respect to the switching element 101 is not more than a predetermined "first set value."

Since the current detecting means 103 detects only an electric current to be carried through the switching element 101, an electric current on the current circulating diode 102 side needs not to be measured thus to enable an inexpensive and simple arrangement.

Further, as the switching element 101, an element having a sensing function such as sense FET can be employed.

In addition, in the arrangement of FIG. 1, data on GND (ground) reference can be obtained and no differential input is required.

By the way, in the case where in the state that an arbitrary electric current is carried in the last switching period, DUTY with respect to the switching element 101 is suddenly brought in full OFF (that is, in the case that an electric current to be carried through the inductive load 100 is intended to be zero), since no electric current is detected in a switching period this time, the electric current value at the current detecting means comes to be zero.

Actually due to, however, the inductive load, the electric current is decreased with a certain time constant, so that it is not zero.

To solve this deviation, the current detecting means 103 makes a correction when ON DUTY (ON time period) with respect to the switching element 101 is not more than a predetermined "first set value".

Here, it is preferable that the current correcting means 104 makes a correction when the OFF time period of the switching element 101 is not less than a predetermined "third set value (=switching period−the first set value)".

Further, in this embodiment, the current correcting means 104 makes a correction when ON DUTY of a pulse with which the switching element 101 is brought in ON/OFF operation (that is, the ON time period of the switching element 101) is not more than the first set value being not more than the sampling period of the current detecting means 103.

In the case that the ON time period of the switching element 101 is not more than the sampling period of the current detecting means 103, there is a possibility that the electric current value of an electric current to be carried through the switching element 101 cannot surely be obtained.

However, by correcting the electric current to be carried through the switching element 101 that the current detecting means 103 detects with the first set value not more than the sampling period of the current detecting means 103, the electric current to be carried through the inductive load 100 can be detected.

Besides, according to this embodiment, the correction by current correcting means 104 is made for each switching period of the switching element 101, and a correction value having been corrected this time is calculated by subtracting a value of a time constant "λ" of an inductive load corresponding to a switching period from an electric current value "Ifb" having been calculated in the last switching period.

That is, the correction value "Iact" of the inductive load current having been corrected this time by the current correcting means 104 is calculated based on the above-given equation (1).

Incidentally, it is preferable that when ON DUTY of the pulse 101a with which the switching element 101 is brought in ON/OFF operation is not less than the first set value, the time constant of the inductive load is calculated in the period when the switching element 101 is ON.

In this case, since the time constant can be operated in real-time, it is unlikely to be affected by, e.g., temperatures.

Accordingly, a storage device for storing a time constant having been operated is unnecessary. Furthermore, a set value needs not to have with each generator (product), thus to possess superior multiplicity of uses.

Embodiment 2

Figure 6:
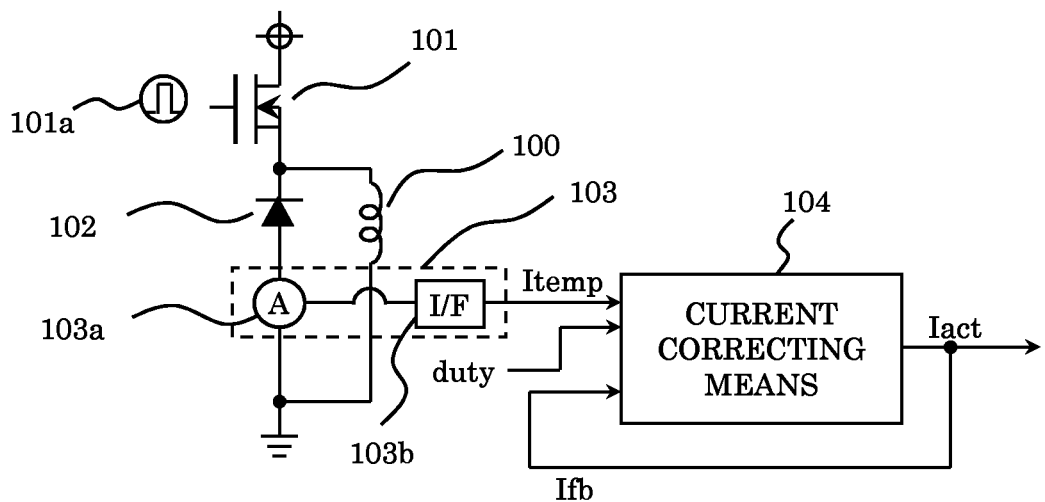
FIG. 6 is a diagram illustrating an arrangement of a current detector of an inductive load according to Embodiment 2.

FIG. 6 is a diagram illustrating a schematic arrangement of a "current detector of an inductive load" according to Embodiment 2 of this invention.

In comparison to the arrangement of the "current detector of an inductive load" according to the above-described Embodiment 1, the current detecting means 103 is located on the GND side (on the ground side) of the current circulating diode 102 so as not to detect an electric current to be carried through the switching element 101 but to detect an electric current to be carried through the current circulating diode (free wheel diode) 102.

Furthermore, in FIG. 6, there is illustrated "High side type" in which the switching element 101 is located on the power source side and the inductive load 100 is located on the GND side (on the ground side).

The other arrangements are the same as those of Embodiment 1 illustrated in FIG. 1, so that further descriptions thereof are omitted herein.

Figure 7:
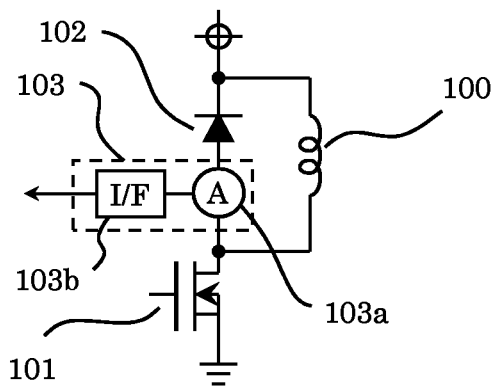
FIG. 7 is a diagram illustrating an arrangement of an essential part of LOW side type.

Incidentally, as a matter of course, as is illustrated in FIG. 7, it is preferable to employ "LOW side type" in which the inductive load 100 is located on the power source side and the switching element 101 is located on the GND side.

Besides, although in FIG. 6, the current detecting means 103 is inserted on the downstream side of the current circulating diode 102, the electric current to be carried through the current circulating diode 102 has only to be detected, so that it is preferable that the current detecting means 103 is located on the upstream side of the current circulating diode 102.

By the way, the electric current to be carried through the current circulating diode 102 is the circulated one of the electric current to be carried through the inductive load 100 in the period when the switching element 101 is OFF.

Therefore, the current detecting means 103 in this embodiment is to detect the electric current to be carried through the current circulating diode 102 (electric current to be carried through the inductive load 100 when the switching element 101 is OFF).

The current detecting means 103, as is illustrated in FIG. 6 or FIG. 7, includes a sensing part 103a such as a shunt resistor or a Hall element and an interface part 103b making a proper conversion of its output.

Although in the arrangement illustrated in FIG. 6, the current detecting means 103 is located so as to detect the electric current to be carried through the current circulating diode 102, as is described above, the electric current to be carried through the current circulating diode 102 is equivalent to the electric current to be carried through the inductive load 100 when the switching element 101 is OFF.

As is illustrated in FIG. 6, a detection current being an output from the current detecting means 103 (that is, a detection value of an "electric current to be carried through the current circulating diode 102") "Itemp", "duty" being an ON time period command of the switching element 101 (that is, an ON pulse of the pulse 101a with which the switching element 101 is brought in ON/OFF operation" and an electric current value "Ifb" after the last correction by the current correcting means 104 are input into the current correcting means 104.

Figure 8:
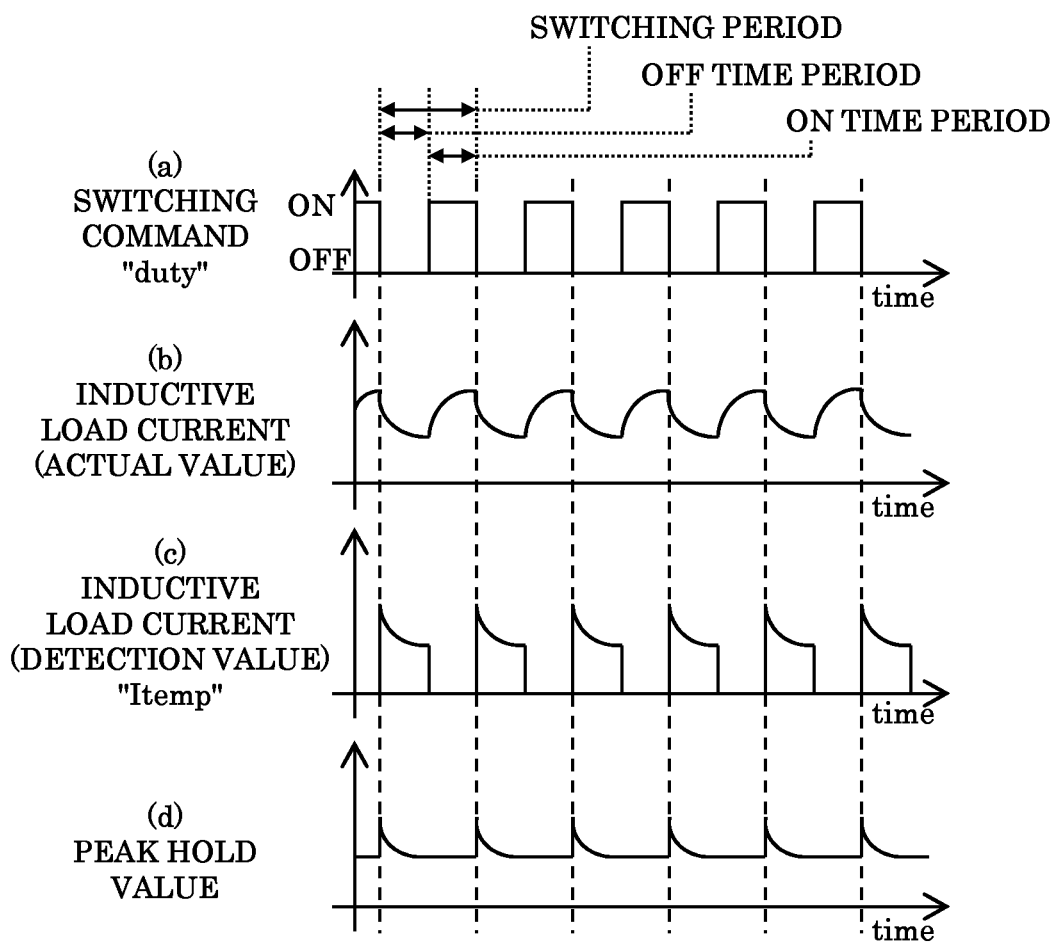
FIG. 8 relate to Embodiment 2 and are waveform charts for explaining the operation in the case that the sampling period of current detecting means is sufficiently short with respect to the ON time period of a switching command.

FIG. 8 are charts illustrating waveforms of each part for explaining the operation of a "general case" in which the sampling period of the current detecting means 103 is sufficiently short with respect to the OFF time period of a switching command.

FIG. 8(a) represents a switching command "duty" being an ON/OFF command with respect to the switching element 101; FIG. 8(b) represents an actual value of the inductive load current to be actually carried through the inductive load 100; and FIG. 8(c) represents a detection value "Itemp" of the inductive load current to be detected at the current detecting means 103.

Here, since the current detecting means 103 can detect only the electric current to be carried through the current circulating diode 102, the detection value "Itemp" of the inductive load current that is equivalent to the electric current to be carried through the current circulating diode 102 is in such a waveform as is illustrated in FIG. 8(c).

Incidentally, the current detecting means 103 detects the electric current to circulate at the current circulating diode 102 in a period when the switching element 101 is OFF.

Thus, the current detecting means 103 is to detect the electric current to be carried through the inductive load 100 only in the period when the switching element 101 is OFF.

Now, FIG. 8(d) represents a peak hold value that is obtained by making a peak hold of the detection value "Itemp" of the inductive load current illustrated in FIG. 8(c) for the switching period.

The peak value of the detection value "Itemp" of the inductive load current is brought in hold by peak hold means not illustrated in the current correcting means 104.

In the case that the sampling period of the current detecting means 103 is sufficiently short with respect to the OFF time period of a switching command, there will be waveforms as is illustrated in FIG. 8. When, however, an inverse relationship holds, its waveforms will not be as is illustrated in FIG. 8.

Figure 9:
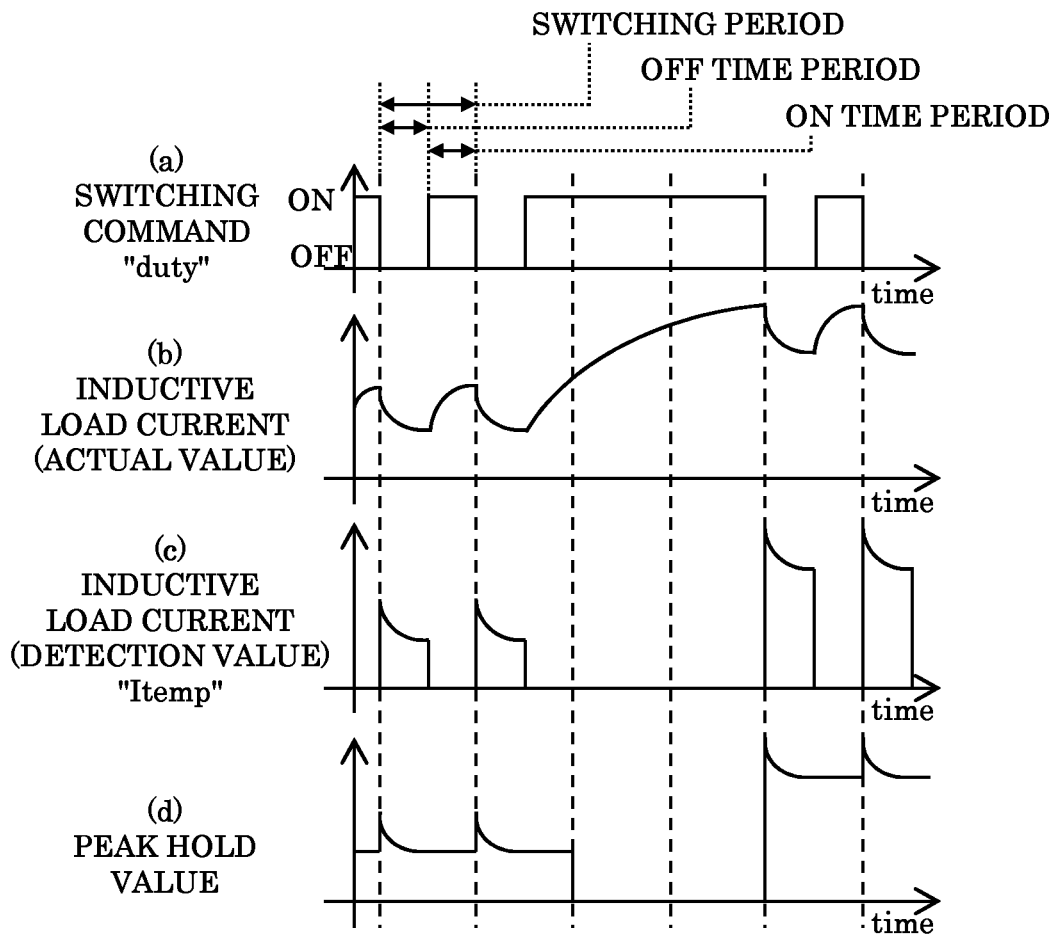
FIG. 9 relate to Embodiment 2 and are waveform charts for explaining the operation in the case that an electric current value to be carried through the inductive load is not corrected using current correcting means.

As an extreme example, waveforms in the case that in the switching period, the OFF time period of a switching command is changed from not less than a sampling period to zero (that is, the case that a switching command is full ON) are illustrated in FIG. 9.

FIG. 9 are charts illustrating waveforms of each part for explaining the operation in the case that an electric current value to be carried through the current circulating diode 102 current detecting means 103 detects (actually an electric current value to be carried through the inductive load 100) is not corrected by current correcting means 104.

FIG. 9(a) represents a switching command "duty" being an ON/OFF command with respect to the switching element 101, and shows the case in which the OFF time period of the switching command is made to be zero.

That is, FIG. 9(a) shows the case in which there comes no OFF pulse of a switching command in midway and it is full ON (fully ON) for the entire switching period.

Incidentally, the ON time period or the OFF time period of the switching command is changed based on the output request of a generator.

Further, FIG. 9(b) represents an actual value of the inductive load current to be actually carried through the inductive load 100, and FIG. 9(c) represent a detection value of an electric current to be carried through the current circulating diode 102 to be detected at the current detecting means 103.

As is illustrated in FIG. 9, on the occasion when "duty" of a switching command is 100 (that is, the OFF time period is zero), no electric current is carried through the current circulating diode 102, so that the detection value "Itemp" of the inductive load current is zero. Therefore, a peak hold value for the switching period comes to be zero as well.

Since, however, the actual inductive load current to be carried through the inductive load 100 is increased with a time constant, for a given period of time to be determined by a time constant, an incorrect value of the inductive load current (incorrect peak hold value) will be obtained.

That is, the waveform of a peak hold value illustrated in FIG. 9(*d*) comes to be an incorrect waveform different from that of the actual value of the inductive load current illustrated in FIG. 9(*b*).

The waveform of this incorrect peak hold value, in the arrangement in which this electric current value is notified with respect to other control devices using, e.g., a serial communication in addition to its control device, since other control devices recognize the incorrect value having been obtained as well, gives rise to the reduction of reliability of the entire system (for example, an engine control system).

In this embodiment, to overcome such a problem, a detection value of the electric current to be carried through the current circulating diode 102 having been detected by the current detecting means 103 (substantially the detection value "Itemp" of the inductive load current) is corrected at the current correcting means 104 and an accurate current value "Iact" of the inductive load current is intended to obtain.

That is, the electric current value "Iact" after correction is calculated based on the following equation (2) with an electric current value "Ifb" having been obtained in the last switching period, a switching period "Tsw" [s] and a time constant "λ" [A/s].

Here, the unit of the time constant "λ" is [A/s] and different from that of a general time constant [s], so that it should be noted.

$$Iact = Ifb + (\lambda \times Tsw) \, [A] \quad \text{equation (2)}$$

Here, it is preferable that the time constant "λ" [A/s] is a predetermined set value or it is preferable that it is sequentially operated in the switching OFF period.

Figure 10:
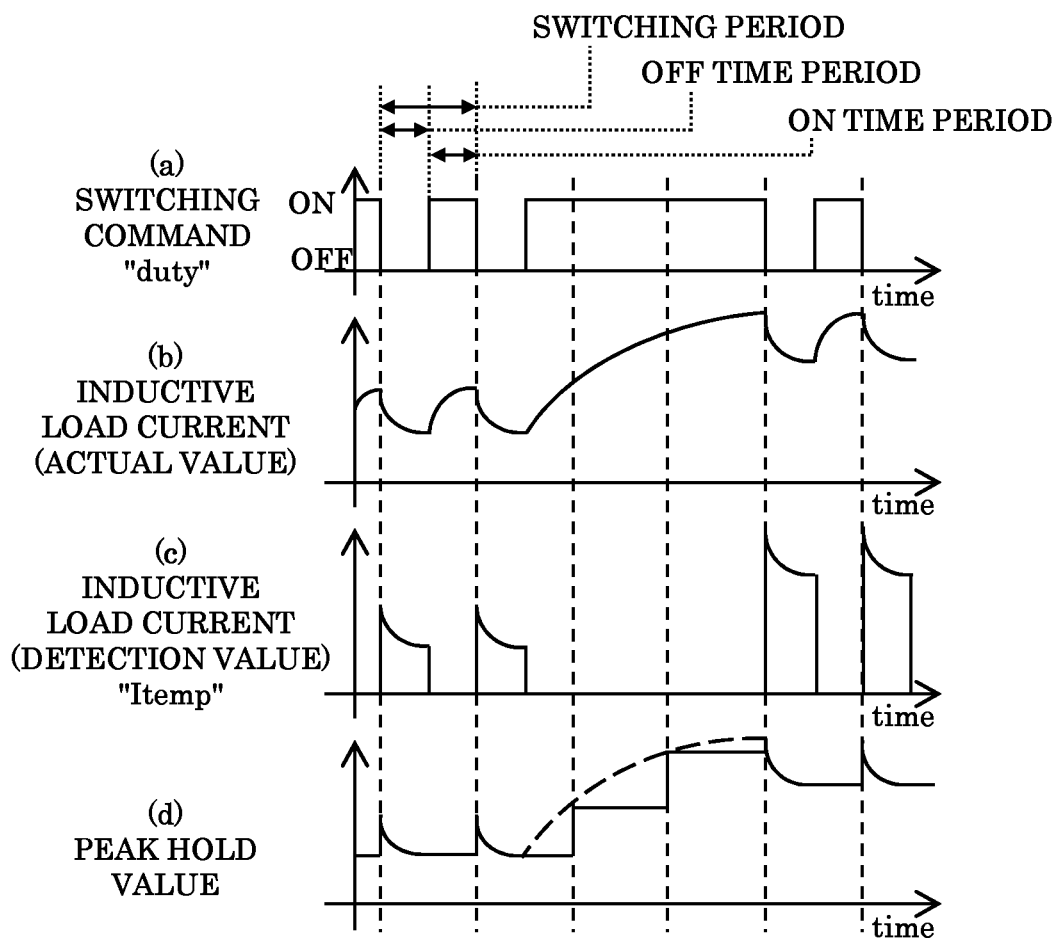
FIG. 10 relate to Embodiment 2 and are waveform charts for explaining the operation in the case that a detection value of an inductive load current is corrected using current correcting means.
Figure 11:
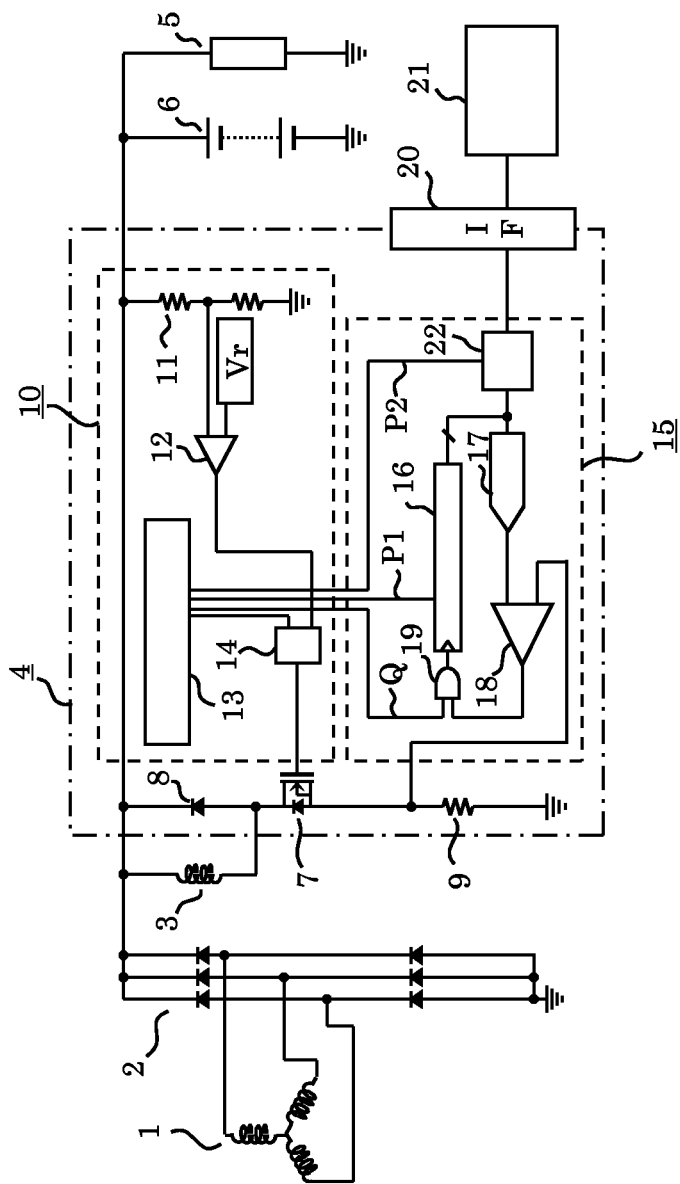
FIG. 11 is a diagram illustrating an arrangement of a conventional controller of a vehicle generator.

Thus, in case where the electric current value "Iact" after correction is operated based on the equation (2), waveforms of each part will be as is illustrated in FIG. 10.

FIG. 10 show the case in which the inductive load current "Itemp" current detecting means 103 detects is corrected by the current correcting means 104.

FIGS. 10(*a*) to 10(*c*) illustrate the same waveforms as those of the above-described FIGS. 9(*a*) to 9(*c*).

That is, FIG. 10(*a*) represents a switching command "duty" being an ON/OFF command with respect to the switching element 101; FIG. 10(*b*) represents an actual value of the inductive load current to be actually carried through the inductive load 100; and FIG. 10(*c*) represents a detection value "Itemp" of the inductive load current to be detected by the current detecting means 103.

In addition, FIG. 10(*d*) illustrates the waveform of a peak hold value to be obtained by making a peak hold of the detection value "Itemp" of the inductive load current illustrated in FIG. 10(*c*) for the switching period. The change waveform (stepped change waveform) of the peak hold value of this FIG. 10(*d*) is a result "Iact" to be obtained by the operation of the above-given equation (2) and corresponds to the change waveform of the "actual value of the inductive load current to be actually carried through the inductive load 100" illustrated in FIG. 10(*b*).

By the way, the broken line in FIG. 10(*d*), for comparison, is a transferred change waveform of the "inductive load current (actual value) to be actually carried through the inductive load" illustrated in FIG. 10(*b*).

The current correcting means 104 in this embodiment, with the use of the waveform of the peak hold value illustrated in FIG. 10(*d*), corrects the inductive load current "Itemp" that the current detecting means 103 detects. That is, the current correcting means 104, with the use of the change waveform of the peak hold value, changes the correction rate of the inductive load current "Itemp" that the current detecting means 103 detects based on DUTY of the pulse with which the switching element 101 is brought in ON/OFF.

As is described above, a current detector of an inductive load according to this embodiment includes: an inductive load 100; a switching element 101 connected in series with the inductive load 100 and controls an electric current to be carried through the mentioned inductive load by ON/OFF operation; a current circulating diode 102 connected in parallel with the inductive load 100 and circulates an electric current of the inductive load 100 when the switching element is OFF; current detecting means 103 making a sampling in a cycle of a predetermined sampling period to detect a circulated current to be carried through the current circulating diode 102; and current correcting means 104 making a correction with respect to the electric current value having been detected at the current detecting means 103, and current correcting means 104 changes the correction rate based on DUTY of a pulse with which the switching element 101 is brought in ON/OFF operation.

As mentioned above, in this embodiment, the current detecting means 103 detects an electric current to circulate at the current circulating diode 102 in a period when the switching element 101 is OFF. Therefore, the current detecting means 103 is to detect an electric current to be carried through the inductive load 100 only in the period when the switching element 101 is OFF.

That is, the current detecting means 103 in this embodiment, different from the case of Embodiment 1, is located so as to detect the electric current to be carried through the current circulating diode 102 in the period when the switching element 101 is OFF. However, the electric current to be carried through the current circulating diode 102 is equivalent to the electric current to be carried through the inductive load 100 when the switching element 101 is ON and thus the electric current to be carried through the inductive load 100 can be detected. In addition, the current correcting means 104 changes the correction rate based on DUTY of the pulse with which the switching element 101 is brought in ON/OFF operation.

Thus, in the same way as in the case of Embodiment 1, even if DUTY of the pulse 101*a* (switching command) with which the switching element 101 is brought in ON/OFF operation is such DUTY as an extremely short pulse of which ON time period is short (for example, an extremely short pulse of which ON time period ends in a sampling timing), an accurate inductive load current value can be detected.

Furthermore, in this embodiment, the current detecting means 103 detects only the electric current to be carried through the current circulating diode 102, so that the electric current on the switching element 101 side needs not to be measured thus to enable an inexpensive and simple arrangement.

Further, as the switching element 101, an element having a sensing function such as sense FET can be employed.

In addition, also in the arrangement of FIG. 6, data on GND (ground) reference can be obtained and no differential input is required.

By the way, at current detecting means 103, in the case where in the state that an arbitrary electric current is carried in the last switching period, DUTY of a switching command with respect to the switching element 101 is suddenly brought in full ON, since the switching element 101 is not brought in ON/OFF operation, no electric current is circulated at the current circulating diode 102.

Accordingly, no electric current is detected in the switching period this time, and thus the electric current value that the current detecting means 103 detects comes to be zero.

Actually, however, due to that the electric current to be carried through the inductive load 100 is increased with a time constant, so that the electric current to be actually carried through the inductive load 100 is not zero.

To solve this deviation, the current detecting means 103 makes a correction when ON DUTY (ON time period) with respect to the switching element 101 is not less than a predetermined "second set value" to obtain (detect) a more accurate current value.

Incidentally, it is preferable that the current correcting means 103 makes a correction when OFF DUTY (OFF time period) with respect to the switching element 101 is not more than a predetermined "fourth set value".

Further, in this embodiment, the "second set value" is a value to be obtained by subtracting an ON time period from the switching period of the switching element 101 (that is, a value corresponding to the OFF time period of the switching element 101) and is not more than the sampling period of the current detecting means 103.

In the case that the OFF time period of the switching element 101 is not more than the sampling period of the current detecting means 103, there is a possibility that the current correcting means 104 cannot surely obtain an electric current value. By setting the second set value as is mentioned above, a correction can reliably be made.

Besides, in this embodiment, the correction by the current correcting means 104 is made for each switching period of the switching element 101, and the electric current value after correction having been corrected by the current correcting means 104 is calculated by adding a value of a time constant of the inductive load 100 corresponding to a switching period to an electric current value having been calculated in the last switching period.

That is, the electric current value after correction having been corrected by the current correcting means 104 is calculated based on the above-given equation (2).

Therefore, since an electric current value after correction can be operated in real-time, it is unlikely to be affected by, e.g., temperatures.

Further, in this embodiment, the mentioned time constant of the inductive load 100, when ON DUTY of the switching element 101 is not more than the mentioned second set value, is calculated in the period when the switching element is OFF.

Thus, since the time constant can be operated in real-time, it is unlikely to be affected by, e.g., temperatures.

Accordingly, a storage device for storing a time constant having been operated is unnecessary.

Incidentally, it is preferable that the time constant of the inductive load 100 employs a constant having been set beforehand.

In this case, it is unnecessary to operate a time constant, thus enabling a smaller software load and a smaller circuit scale.

By the way, in this embodiment, the relationship between the sampling period of the current detecting means 104, the switching period of the switching element 101 and the time constant of the inductive load 100 is:

sampling period≤switching period≤time constant.

This relationship is the same as in Embodiment 1.

INDUSTRIAL APPLICABILITY

The present invention can accurately detect a value of an electric current to be carried through an inductive load such as a field coil of a generator and is useful for providing a "current detector of an inductive load" preferably for use in a controller of a vehicle generator.

The invention claimed is:

1. A current detector, comprising:
an inductive load;
a switching element that is connected in series with said inductive load and which controls an electric current carried through said inductive load by an ON/OFF operation;
a current circulating diode that is connected in parallel with said inductive load and which circulates an electric current of the inductive load when said switching element is OFF;
a current detecting means which samples a cycle of a predetermined sampling period to detect an electric current carried through said switching element; and
a current correcting means which makes a correction with respect to an electric current value having been detected at said current detecting means,
wherein said current correcting means changes a correction rate based on a DUTY of a pulse with which said switching element is brought in ON/OFF operation, and
wherein an output current of the current correcting means is used as an input to the current correcting means.

2. The current detector according to claim 1, wherein said current correcting means makes the correction when an ON DUTY of the pulse with which said switching element is brought in ON/OFF operation is not more than a predetermined first set value.

3. The current detector according to claim 2, wherein said predetermined first set value is not more than the predetermined sampling period of said current detecting means.

4. The current detector according to claim 1, wherein the correction by said current correcting means is made for each switching period of said switching element, and a correction value having been corrected is calculated by subtracting a product of a switching period from an electric current value having been calculated in a previous switching period from a value of a time constant of an inductive load.

5. The current detector according to claim 4, wherein the time constant of said inductive load, when an ON DUTY of a pulse with which said switching element is brought in ON/OFF operation is not less than said predetermined first set value, is calculated in a period when said switching element is ON.

6. The current detector according to claim 4, wherein the time constant of said inductive load employs a constant having been set beforehand.

7. A current detector, comprising:
an inductive load;
a switching element that is connected in series with said inductive load and which controls an electric current carried through said inductive load by an ON/OFF operation;
a current circulating diode that is connected in parallel with said inductive load and which circulates an electric current of said inductive load when said switching element is OFF;

a current detecting means which samples a cycle of a predetermined sampling period to detect a circulated current carried through said current circulating diode; and a current correcting means which makes a correction with respect to an electric current value having been detected at said current detecting means, wherein said current correcting means changes a correction rate based on a DUTY of a pulse with which said switching element is brought in ON/OFF operation, and wherein an output current of the current correcting means is used as an input to the current correcting means.

8. The current detector according to claim 7, wherein said current correcting means makes the correction when an ON DUTY with respect to said switching element is not less than a predetermined second set value.

9. The current detector according to claim 8, wherein said predetermined second set value is a value obtained by subtracting an ON time period from the switching period of said switching element, and is not more than the predetermined sampling period of said current detecting means.

10. The current detector according to claim 7, wherein the correction by said current correcting means is made for each switching period of said switching element, and an electric current value after correction having been corrected by said current correcting means is calculated by adding a product of a value of a time constant of said inductive load multiplied by a switching period to an electric current value having been calculated in a previous switching period.

11. The current detector according to claim 10, wherein said time constant of said inductive load, when an ON DUTY of said switching element is not more than a second set value, is calculated in a period when said switching element is OFF.

12. The current detector according to claim 10, wherein the time constant of said inductive load employs a constant having been set beforehand.

* * * * *